United States Patent
Baburske et al.

(10) Patent No.: US 10,217,837 B2
(45) Date of Patent: *Feb. 26, 2019

(54) METHOD OF MANUFACTURING A SEMICONDUCTOR DEVICE HAVING ELECTRODE TRENCHES, ISOLATED SOURCE ZONES AND SEPARATION STRUCTURES

(71) Applicant: Infineon Technologies AG, Neubiberg (DE)

(72) Inventors: Roman Baburske, Otterfing (DE); Matteo Dainese, Villach (AT); Peter Lechner, Holzkirchen (DE); Hans-Joachim Schulze, Taufkirchen (DE); Johannes Georg Laven, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/830,789

(22) Filed: Dec. 4, 2017

(65) Prior Publication Data

US 2018/0090594 A1 Mar. 29, 2018

Related U.S. Application Data

(60) Continuation of application No. 15/422,049, filed on Feb. 1, 2017, now Pat. No. 9,837,506, which is a
(Continued)

(51) Int. Cl.
*H01L 29/45* (2006.01)
*H01L 29/66* (2006.01)
(Continued)

(52) U.S. Cl.
CPC .. *H01L 29/66348* (2013.01); *H01L 21/02238* (2013.01); *H01L 21/76224* (2013.01);
(Continued)

(58) Field of Classification Search
None
See application file for complete search history.

(56) References Cited

U.S. PATENT DOCUMENTS

| | | | |
|---|---|---|---|
| 6,060,747 | A | 5/2000 | Okumura et al. |
| 6,566,691 | B1 | 5/2003 | Inoue et al. |

(Continued)

FOREIGN PATENT DOCUMENTS

| | | |
|---|---|---|
| CN | 101840919 A | 9/2010 |
| DE | 112011100533 T5 | 12/2012 |
| JP | 2012227255 A | 11/2012 |

*Primary Examiner* — Bradley K Smith
(74) *Attorney, Agent, or Firm* — Murphy, Bilak & Homiller, PLLC

(57) ABSTRACT

A semiconductor device includes a semiconductor mesa having source zones and at least one body zone forming first pn junctions with the source zones and a second pn junction with a drift zone. Electrode structures are provided on opposite sides of the semiconductor mesa, at least one of the electrode structures having a gate electrode configured to control a charge carrier flow through the at least one body zone. A separation region is arranged along an extension direction of the semiconductor mesa. In the separation region, the semiconductor mesa has a constricted portion that is partially or completely oxidized. Additional semiconductor device embodiments are described.

20 Claims, 15 Drawing Sheets

Related U.S. Application Data division of application No. 14/275,378, filed on May 12, 2014, now Pat. No. 9,570,577.

(51) Int. Cl.
    *H01L 29/739*     (2006.01)
    *H01L 29/10*     (2006.01)
    *H01L 29/08*     (2006.01)
    *H01L 29/40*     (2006.01)
    *H01L 29/423*     (2006.01)
    *H01L 29/04*     (2006.01)
    *H01L 21/02*     (2006.01)
    *H01L 21/762*     (2006.01)
    *H01L 29/06*     (2006.01)

(52) U.S. Cl.
    CPC ........ *H01L 29/045* (2013.01); *H01L 29/0649* (2013.01); *H01L 29/0696* (2013.01); *H01L 29/0843* (2013.01); *H01L 29/0865* (2013.01); *H01L 29/1095* (2013.01); *H01L 29/404* (2013.01); *H01L 29/407* (2013.01); *H01L 29/4236* (2013.01); *H01L 29/4238* (2013.01); *H01L 29/42368* (2013.01); *H01L 29/6634* (2013.01); *H01L 29/7395* (2013.01); *H01L 29/7397* (2013.01); *H01L 29/0619* (2013.01); *H01L 29/7396* (2013.01)

(56) References Cited

U.S. PATENT DOCUMENTS

| | | |
|---|---|---|
| 7,075,147 B2 | 7/2006 | Cao |
| 7,598,566 B2 | 10/2009 | Hotta et al. |
| 8,344,480 B2 | 1/2013 | Seok et al. |
| 8,633,510 B2 | 1/2014 | Matsuura et al. |
| 8,746,702 B1 * | 6/2014 | Benedict .............. B25D 17/088 279/125 |
| 8,853,774 B2 | 10/2014 | Cotorogea et al. |
| 8,994,102 B2 | 3/2015 | Hikasa |
| 9,876,100 B2 | 1/2018 | Baburske et al. |
| 2005/0006700 A1 | 1/2005 | Cao |
| 2009/0283799 A1 | 11/2009 | Ruething et al. |
| 2010/0078674 A1 | 4/2010 | Seok et al. |
| 2010/0155773 A1 | 6/2010 | Parthasarathy et al. |
| 2012/0292662 A1 | 11/2012 | Matsuura et al. |
| 2013/0181283 A1 | 7/2013 | Sato |
| 2014/0054644 A1 | 2/2014 | Hikasa |
| 2014/0070270 A1 | 3/2014 | Yoshida et al. |
| 2015/0221756 A1 | 8/2015 | Vellei et al. |

* cited by examiner

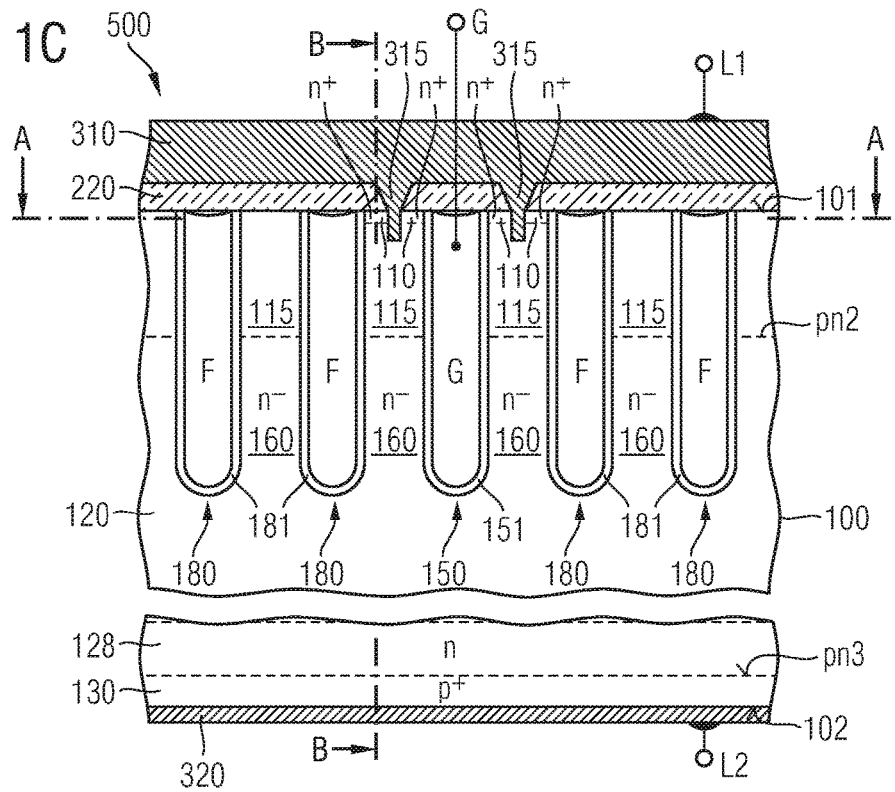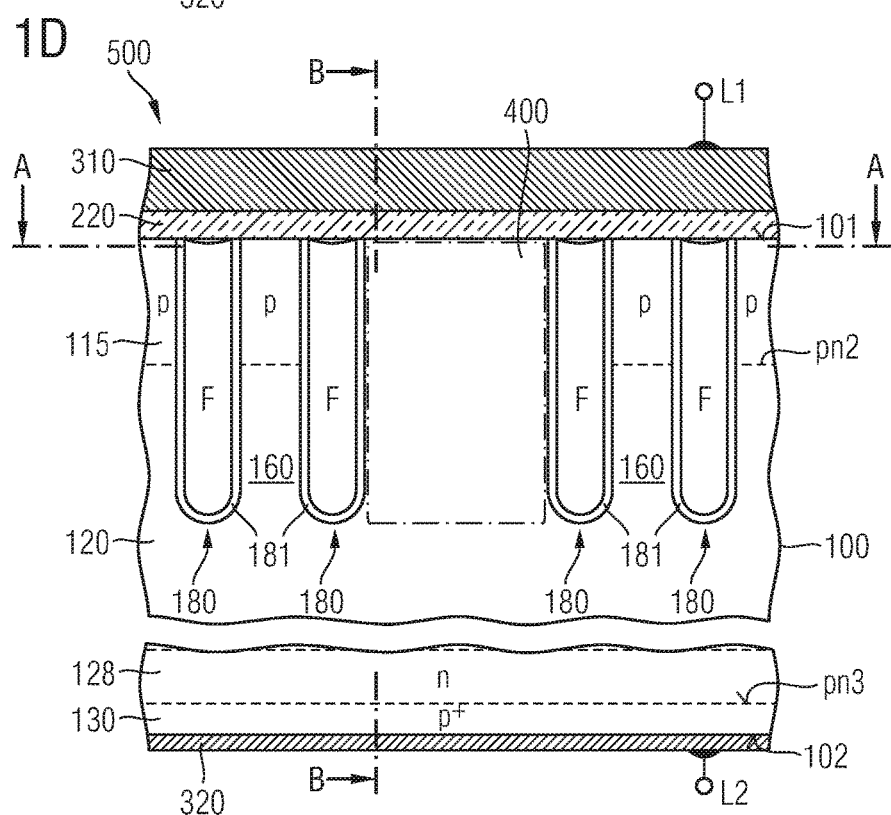

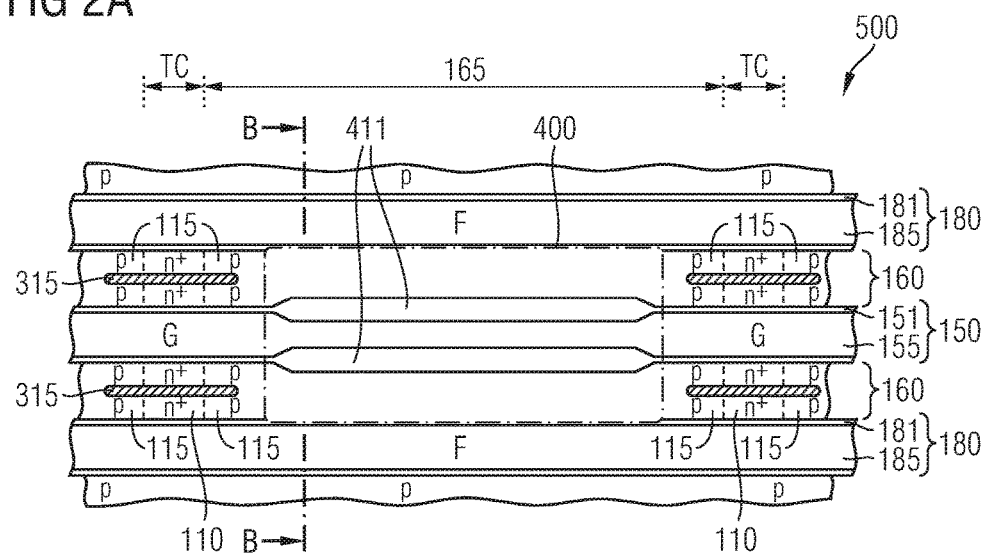
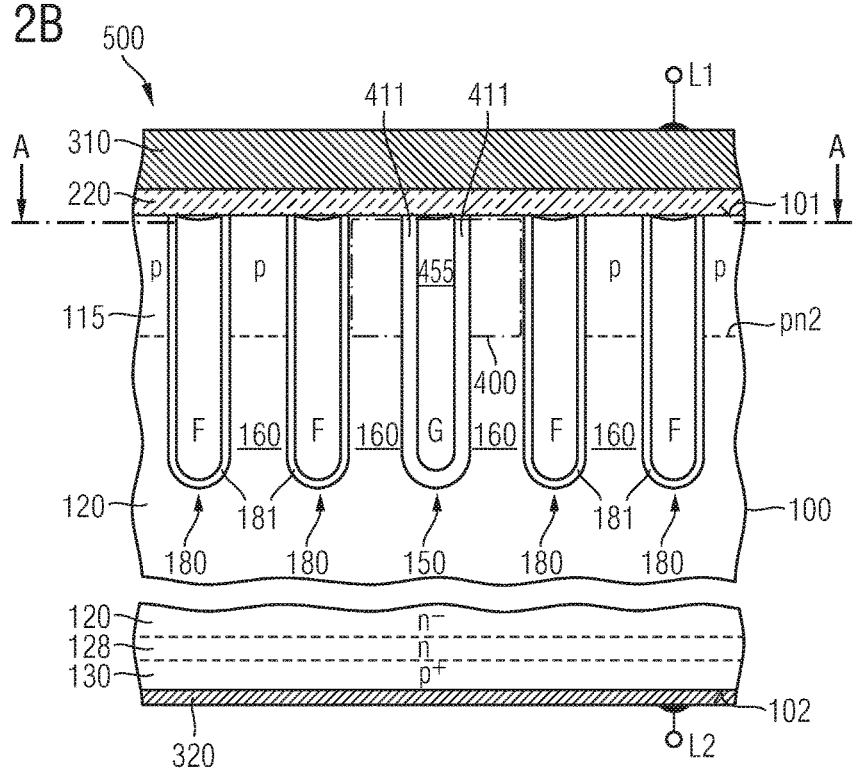

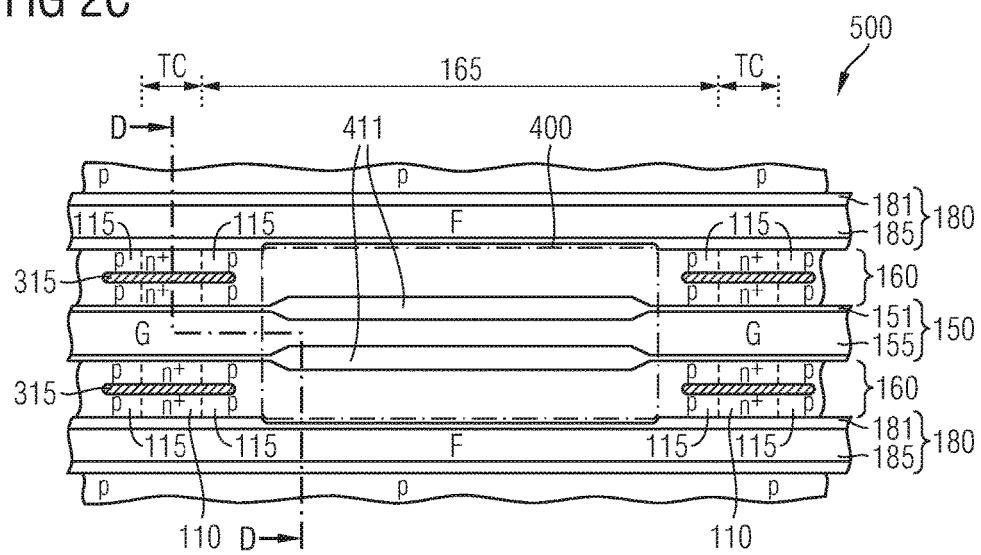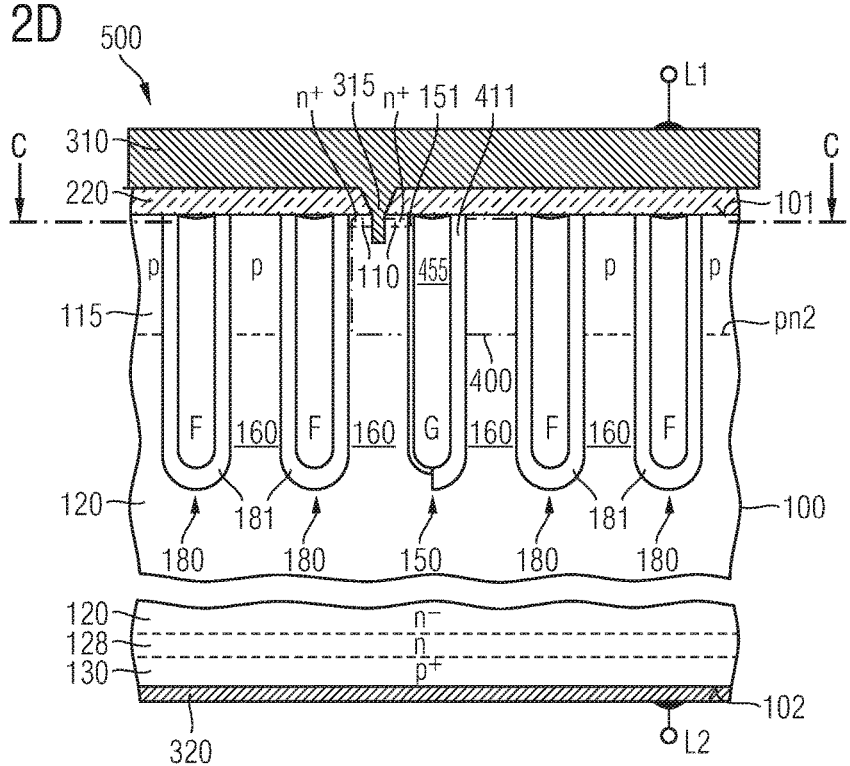

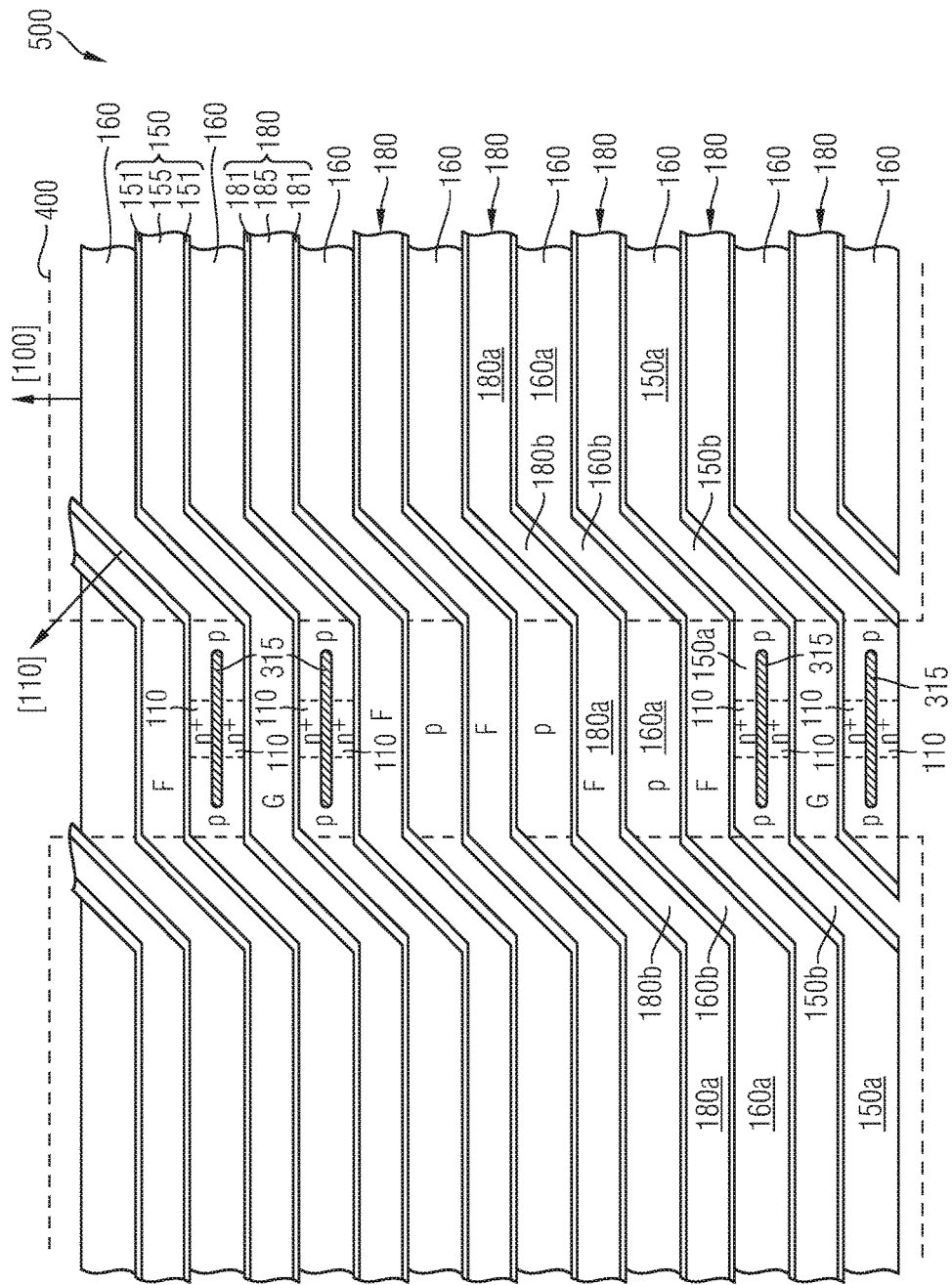

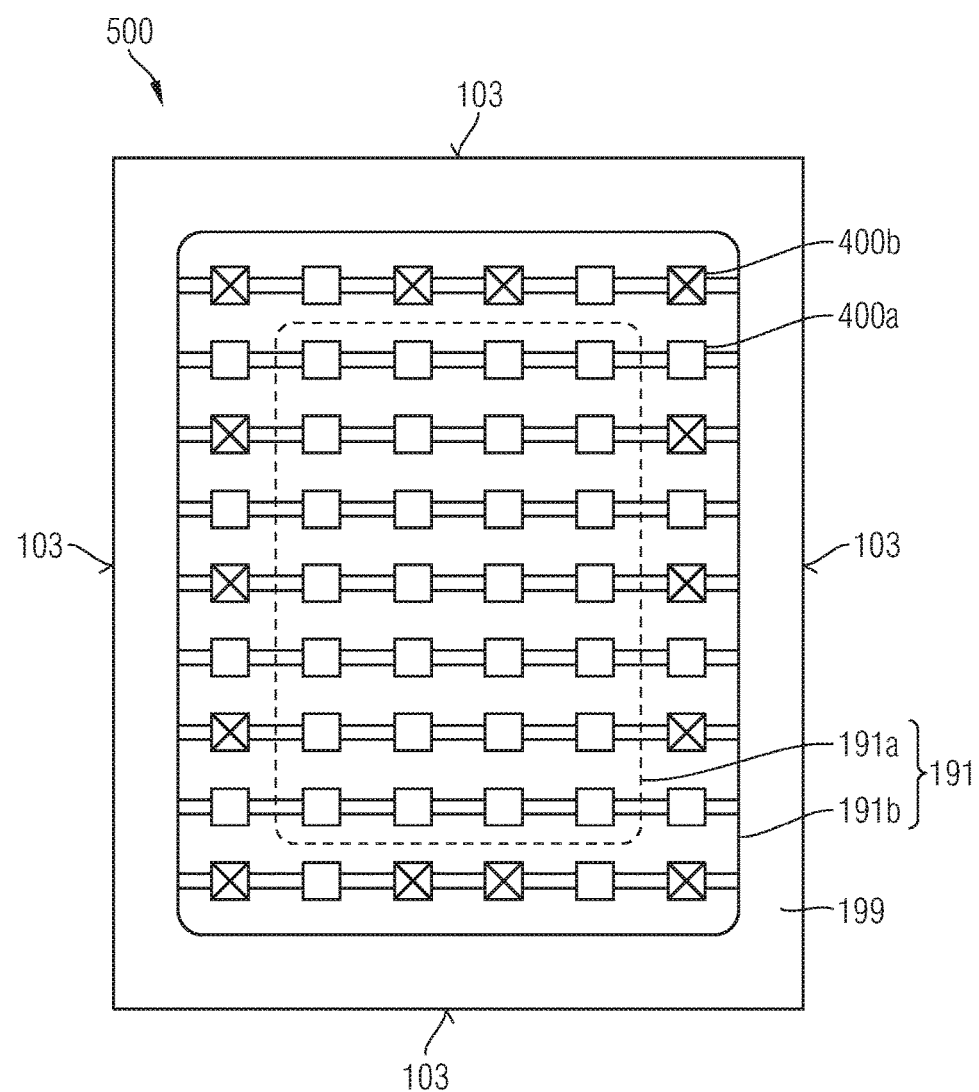

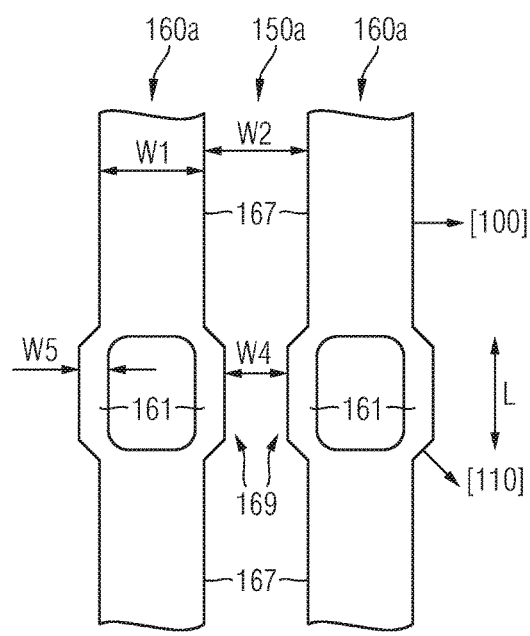
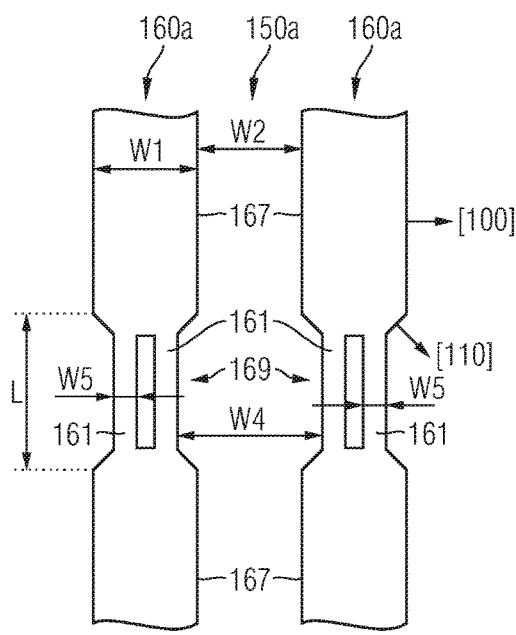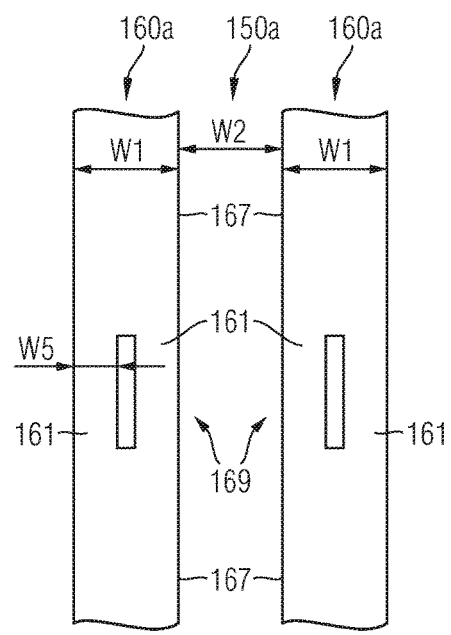

METHOD OF MANUFACTURING A SEMICONDUCTOR DEVICE HAVING ELECTRODE TRENCHES, ISOLATED SOURCE ZONES AND SEPARATION STRUCTURES

BACKGROUND

In semiconductor switching devices like IGBTs (insulated gate bipolar transistors) as well as RC-IGBTs (reverse conducting IGBTs) mobile charge carriers flood a low-doped drift zone and form a charge carrier plasma that provides a low on-state resistance. For achieving high short-circuit robustness, source zones are formed only in portions of the cell area in order to limit the maximum short-circuit current. On the other hand, reducing the source zone area may adversely affect the charge carrier plasma in the drift zone. It is desirable to provide semiconductor devices with improved switching characteristics.

SUMMARY

According to an embodiment a semiconductor device includes a semiconductor mesa including at least one body zone forming first pn junctions with source zones and a second pn junction with a drift zone. Electrode structures are on opposite sides of the semiconductor mesa. At least one of the electrode structures includes a gate electrode configured to control a charge carrier flow through the at least one body zone. In a separation region between the source zones, which are arranged along an extension direction of the semiconductor mesa, the semiconductor mesa includes at least one partial or complete constriction.

According to another embodiment an insulated gate bipolar transistor includes a semiconductor mesa including at least one body zone forming first pn junctions with source zones and a second pn junction with a drift zone. Electrode structures are on opposite sides of the semiconductor mesa. At least one of the electrode structures includes a gate electrode configured to control a charge carrier flow through the at least one body zone. In a separation region between source zones, which are arranged along an extension direction of the semiconductor mesa, the semiconductor mesa includes at least one partial or complete constriction.

According to another embodiment a method of manufacturing a semiconductor device includes forming electrode trenches in a semiconductor substrate between semiconductor mesas that separate the electrode trenches. The semiconductor mesas include portions of a drift layer of a first conductivity type and a body layer of a second, complementary conductivity type between a first surface of the semiconductor substrate and the drift layer, respectively. Isolated source zones of the first conductivity type are formed in the semiconductor mesas, wherein the source zones extend from the first surface into the body layer. Separation structures are formed in the semiconductor mesas between neighboring source zones, which are arranged along an extension direction of the semiconductor mesas. The separation structures form partial or complete constrictions of the semiconductor mesa, respectively Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1C is a schematic cross-sectional view of the semiconductor device portion of FIG. 1A along line C-C.

FIG. 1D is a schematic cross-sectional view of the semiconductor device portion of FIG. 1A along line D-D.

FIG. 2A is a schematic lateral cross-sectional view of a portion of a semiconductor device in accordance with an embodiment including an elongate separation structure.

FIG. 2B is a schematic cross-sectional view of the semiconductor device portion of FIG. 2A along line B-B.

FIG. 2C is a schematic lateral cross-sectional view of a portion of a semiconductor device in accordance with a further embodiment including an elongate separation structure in combination with thick field dielectrics.

FIG. 2D is a schematic cross-sectional view of the semiconductor device portion of FIG. 2C along line B-B.

FIG. 3 is a schematic lateral cross-sectional view of a portion of an IGBT in accordance with an embodiment including separation regions resulting from semiconductor mesas with straight and slanted portions.

FIG. 6 is a schematic plan view of a layout of a semiconductor device according to an embodiment providing different types of separation regions.

FIG. 8F is a schematic plan view of a layout for precursor semiconductor mesas according to an embodiment providing widely spaced mesa branches as constricted portions.

FIG. 8G is a schematic plan view of a layout for precursor semiconductor mesas according to an embodiment providing narrowly spaced mesa branches as constricted portions.

FIG. 8H is a schematic plan view of a layout for precursor semiconductor mesas according to a further embodiment providing mesa branches as constricted portions.

DETAILED DESCRIPTION

Figure 1A:
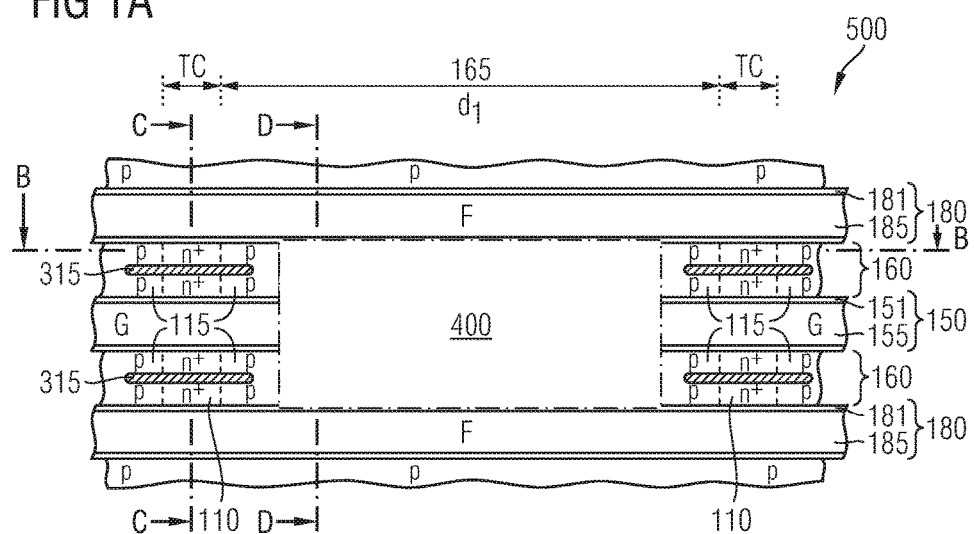
FIG. 1A is a schematic lateral cross-sectional view of a portion of a semiconductor device with a separation region between neighboring source zones in accordance with an embodiment.
Figure 1B:
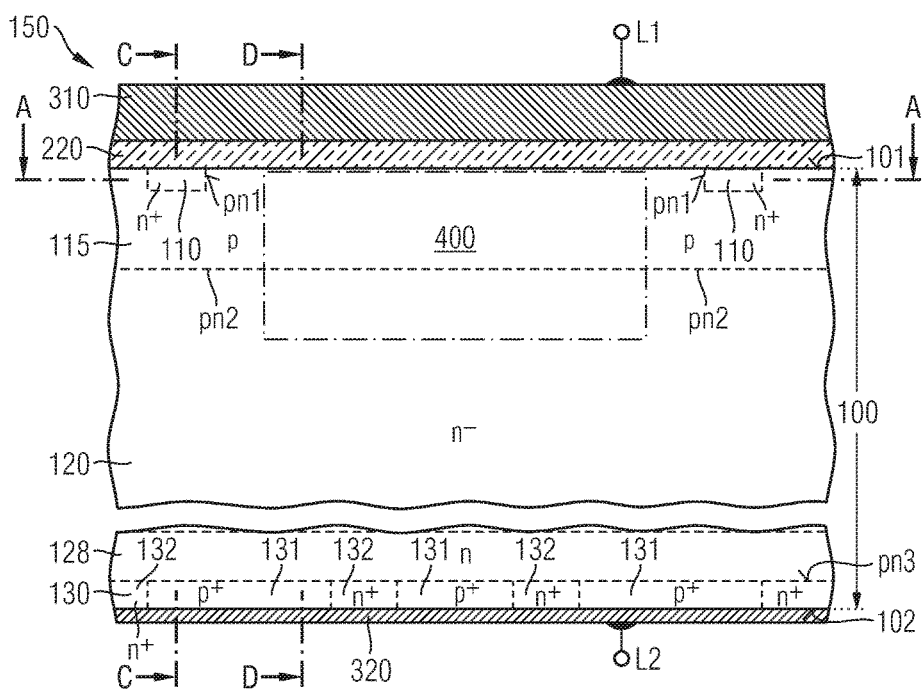
FIG. 1B is a schematic cross-sectional view of the semiconductor device portion of FIG. 1A along line B-B.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1D illustrate a portion of a semiconductor device 500 including a separation structure 400 between neighboring isolated source zones 110 assigned to the same semiconductor mesa 160.

The semiconductor device 500 may be a semiconductor diode, an IGBT (insulated gate bipolar transistor), e.g., a reverse blocking IGBT or an RC-IGBT (reverse conducting IGBT) or a thyristor. A semiconductor body 100 of the semiconductor device 500 is provided from a single crystalline semiconductor material, for example silicon (Si), silicon carbide (SiC), germanium (Ge), a silicon germanium crystal (SiGe), gallium nitride (GaN) or gallium arsenide (GaAs) by way of example.

The semiconductor body 100 has a first surface 101, which may be approximately planar or which may be defined by a plane spanned by coplanar surface sections, as well as a mainly planar second surface 102 parallel to the first surface 101. A minimum distance between the first and second surfaces 101, 102 depends on the voltage blocking capability specified for the semiconductor device 500. For example, the distance between the first and second surfaces 101, 102 may be in a range from 90 µm to 120 µm for a semiconductor device specified for a blocking voltage of about 1200 V. Other embodiments related to semiconductor devices with high blocking capabilities may provide semiconductor bodies 100 with a thickness of several 100 µm. For semiconductor devices with lower blocking voltage the thickness may be in a range from 35 µm to 90 µm.

In a plane parallel to the first surface 101 the semiconductor body 100 may have a rectangular shape with an edge length in the range of several millimeters. A normal to the first surface 101 defines a vertical direction and directions orthogonal to the vertical direction are lateral directions.

The semiconductor body 100 includes a drift zone 120 of a first conductivity type, a body zone 115 of a second conductivity type, which is opposite to the first conductivity type, between the first surface 101 and the drift zone 120 as well as a pedestal layer 130 between the drift zone 120 and the second surface 102.

For the illustrated embodiments the first conductivity type is the n-type and the second conductivity type is the p-type. Similar considerations as outlined below apply to embodiments with the first conductivity type being the p-type and the second conductivity type being the n-type.

An impurity concentration in the drift zone 120 may gradually or in steps increase or decrease with increasing distance to the first surface 101 at least in portions of its vertical extension. According to other embodiments the impurity concentration in the drift zone 120 may be approximately uniform. For IGBTs based on silicon, a mean impurity concentration in the drift zone 120 may be between $5 \times 10^{12}$ (5E12) cm$^{-3}$ and $1 \times 10^{15}$ (1E15) cm$^{-3}$, for example in a range from $1 \times 10^{13}$ (1E13) cm$^{-3}$ to $1 \times 10^{14}$ (1E14) cm$^{-3}$. In the case of a semiconductor device based on SiC, a mean impurity concentration in the drift zone 120 may be between $5 \times 10^{14}$ (5E14) cm$^{-3}$ and $1 \times 10^{17}$ (1E17) cm$^{-3}$, for example in a range from $1 \times 10^{15}$ (1E15) cm$^{-3}$ to $1 \times 10^{16}$ (1E16) cm$^{-3}$.

The pedestal layer 130 may have the second conductivity type, wherein a mean impurity concentration for a p-type pedestal layer 130 may be at least $1 \times 10^{16}$ (1E16) cm$^{-3}$, for example at least $5 \times 10^{17}$ (5E17) cm$^{-3}$. According to other embodiments the pedestal layer may include zones of both conductivity types extending between the drift zone 120 and the second surface 102.

A field stop layer 128 of the first conductivity type may separate the pedestal layer 130 from the drift zone 120, wherein a mean net impurity concentration in the field stop layer 128 may be lower than the impurity concentration in the pedestal layer 130 by at least one order of magnitude and may be higher than in the drift zone 120 by at least one order of magnitude.

Electrode structures 150, 180 extend from the first surface 101 into the drift zone 120. Portions of the semiconductor body 100 between neighboring electrode structures 150, 180 form semiconductor mesas 160. According to an embodiment, the electrode structures 150, 180 extend between the first surface 101 and a bottom plane having a greater distance to the first surface 101 than the second pn junctions pn2.

The electrode structures 150, 180 may be stripes extending along an extension direction of the semiconductor mesas 160. According to an embodiment, the extension direction may be parallel to a first lateral direction such that the semiconductor mesas 160 and electrode structures 150, 180 are straight stripe structures. According to another embodiment, the extension direction alters with respect to the first lateral direction such that the semiconductor mesas 160 and electrode structures 150, 180 are staggered lines or zigzag lines. The semiconductor mesas 160 may be regularly arranged at a uniform pitch (center-to-center distance) of, for example, 400 nm to 20 μm, for example 800 nm to 2 μm.

Active electrode structures 150 may include a gate electrode 155 and a gate dielectric 151 separating the gate electrode 155 from the semiconductor body 100. The gate electrode 155 may be a homogenous structure or may have a layered structure including one or more conductive layers. According to an embodiment the gate electrode 155 may include or consist of heavily doped polycrystalline silicon.

The gate dielectric 151 may include or consist of a semiconductor oxide, for example thermally grown or deposited silicon oxide, a semiconductor nitride, for example deposited or thermally grown silicon nitride, or a semiconductor oxynitride, for example silicon oxynitride.

Passive electrode structures 180 may include a field electrode 185 and a field dielectric 181 separating the field electrode 185 from the semiconductor body 100. The field electrode 185 may be a homogenous structure or may have a layered structure including one or more conductive layers. According to an embodiment, the field electrode 185 may include or consist of a heavily doped polycrystalline silicon layer. The field electrode 185 and the gate electrode 155 may have the same configuration and may include the same materials.

The field dielectric 181 may include or consist of a semiconductor oxide, for example thermally grown or deposited silicon oxide, a semiconductor nitride, for example deposited or thermally grown silicon nitride, or a semiconductor oxynitride, for example silicon oxynitride. The field and gate dielectrics 151, 181 may have the same configuration and/or may include the same materials.

Active and passive electrode structures 150, 180 may alternate in a regular fashion. For example, one single passive electrode structure 180 may be arranged between each pair of active electrode structures 150. According to other embodiments, two, three or more passive electrode structures 180 may be arranged between each pair of active electrode structures 150. The respective arrangement of active and passive electrode structures 150, 180 may vary over a lateral direction of the semiconductor body 100. E.g., the number of passive electrode structures 180 between each pair of active electrode structures 150 may increase or decrease continuously or stepwise with decreasing distance to an edge termination area of the semiconductor body 100. A further embodiment may exclusively include active electrode structures 150.

The gate electrodes 155 may be electrically connected to a gate terminal G of the semiconductor device 500. The field electrodes 185 may be electrically connected to an auxiliary terminal of the semiconductor device 500 or may be electrically connected with one of the load electrodes of the semiconductor device 500. For example, the field electrode 185 may be electrically connected or coupled to the IGBT emitter electrode.

A distance between the first surface 101 and a bottom of the electrode structures 150, 180 may range from 1 μm to 30 μm, e.g., from 3 μm to 7 μm. A lateral width of the semiconductor mesas 160 may range from 0.05 μm to 10 μm, e.g., from 0.1 μm to 1 μm.

The body zones 115 are formed in first sections of the semiconductor mesas 160 oriented to the first surface 101 and may directly adjoin to the first surface 101 in sections of each semiconductor mesa 160. A mean net impurity concentration in the body zones 115 may be in the range from $1 \times 10^{16}$ (1E16) cm$^{-3}$ to $5 \times 10^{18}$ (5E18) cm$^{-3}$, for example between $1 \times 10^{17}$ (1E17) cm$^{-3}$ and $5 \times 10^{17}$ (5E17) cm$^{-3}$. Each body zone 115 forms a second pn junction pn2 with the drift zone 120.

First semiconductor mesas 160 adjoining to at least one active electrode structure 150 further include source zones 110 forming first pn junctions pn1 with the body zone 115. Second semiconductor mesas 160 between passive electrode structures 180 may be devoid of any source zones 110.

The source zones 110 may be formed as wells extending from the first surface 101 into the body zone 115 and define transistor cells TC arranged at a first distance dl along the longitudinal axis of the respective semiconductor mesa 160. Shadowed regions 165 without source zones 110 separate neighboring transistor cells TC assigned to the same semiconductor mesa 160, wherein in the shadowed regions 165 the body zone 115 of the semiconductor mesa 160 directly adjoins the first surface 101. Transistor cells TC and shadowed regions 165 alternate along the longitudinal axis of the respective semiconductor mesa 160.

The first distance dl between neighboring source zones 110 arranged along the second lateral direction may be in a range from 1 μm to 200 μm, for example in a range from 5 μm to 100 μm.

A dielectric structure 220 separates a first load electrode 310 from the first surface 101. The dielectric structure 220 may include one or more dielectric layers from silicon oxide, silicon nitride, silicon oxynitride, doped or undoped silicon glass, for example BSG (boron silicate glass), PSG (phosphorus silicate glass), or BPSG (boron phosphorus silicate glass), by way of example.

The first load electrode 310 may be an IGBT emitter electrode or may be electrically coupled or connected to a first load terminal L1 which may be the IGBT emitter terminal of the semiconductor device 500.

Contact structures 315 extend through the dielectric structure 220 and may extend into the semiconductor body 100. The contact structures 315 electrically connect the first load electrode 310 with the source zones 110 and the body zones 115. According to embodiments related, e.g., to reverse blocking IGBTs, for each semiconductor mesa 160 a plurality of spatially separated contact structures 315 may be approximately aligned with the source zones 110, wherein the contact structures 315 may overlap with the body zones 115 for some 10 nm and/or may cut through the source zones 110 in both the extension direction and the vertical direction.

A second load electrode 320 directly adjoins the second surface 102 and the pedestal layer 130. The second load electrode 320 may be or may be electrically connected to a second load terminal L2, which may be the IGBT collector terminal.

Each of the first and second load electrodes 310, 320 may consist of or contain, as main constituent(s) aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), silver (Ag), gold (Au), platinum (Pt), and/or palladium (Pd). For example, at least one of the first and second load electrodes 310, 320 may include two or more sub-layers, wherein each sub-layer contains one or more of Ni, Ti, Ag, Au, Pt, W, and Pd as main constituent(s), e.g., a silicide, a nitride and/or an alloy.

A separation region 400 between neighboring source zones 110 arranged along an extension direction of the semiconductor mesa 160 includes at least one partial or complete constriction. In the respective partially or completely constricted section a vertical cross-sectional area of the semiconductor mesa 160 orthogonal to the extension direction is zero or smaller than outside of the constricted section and outside of the separation region 400. A distance between two electrode structures 150, 180 on opposite sides of the semiconductor mesa 160 is smaller at the constricted section of the semiconductor mesa 160 than outside the constricted section. The partial or complete constriction increases the lateral resistance for majority charge carriers of the body zones 115, e.g. holes for n-channel IGBTs.

In the following description the effect of the separation region 400 is described by reference to an n-channel IGBT with n-type source and drift zones 110, 120 and p-type body zones 115. The same considerations analogously apply to p-channel IGBTs.

In an on-state of the semiconductor device 500 a voltage applied to the gate electrodes 155 exceeds a threshold voltage at which an n-type inversion layer is formed through the body zones 115. When between the first and second load electrodes 310, 320 a voltage $V_{CE}$ is applied that exceeds the built-in voltage of the third pn junctions pn3 between the drift zone 120 or the field stop layer 128 and the p-type pedestal layer 130, the resulting electron flow between the first and second load electrodes 310, 320 forward biases the third pn junctions pn3 and the pedestal layer 130 injects holes into the drift zone 120. In the drift zone 120 the injected holes in combination with the electron flow form a high-density charge carrier plasma that results in a low collector-to-emitter saturation voltage $V_{CE,sat}$ and in low on-state losses.

The separation region 400 reduces a portion of a hole current outside the transistor cells TC, i.e., outside the vertical projection of the sources zones 110 in the semiconductor mesas 160 and within the shadowed regions 165. As a result, the hole current is in closer local agreement with the electron current, plasma density is further increased and thereby $V_{CE,sat}$ sat significantly reduced. The embodiments illustrated in the following figures are based on the semiconductor device 500 of FIGS. 1A to 1D and the description of the following embodiments refers to and includes the description of FIGS. 1A to 1D.

In the semiconductor device 500 of FIGS. 2A to 2B an ancillary dielectric 411 replaces the gate dielectric 151 in the separation region 400. The ancillary dielectric 411 may be thicker than the gate dielectric 151 such that the vertical cross-sectional area of the semiconductor mesa 160 is reduced and the hole flow better confined.

In the semiconductor device 500 of FIGS. 2C and 2D the field dielectrics 181 are thicker than the gate dielectrics 151. According to an embodiment, the thickness of the field dielectrics 181 may be equal or approximately equal to the thickness of the ancillary dielectric 411. As illustrated in FIG. 2D, the thick field dielectrics 181 as well as the ancillary dielectric 411 extend deeper into the semiconductor body 100 than the gate dielectric 151 such that the thick dielectrics 181, 411 locally attenuate the electric field and the thin gate dielectrics 151 are subjected to lower electric field strengths. As a consequence, the reliability of the thin gate dielectrics 151 is improved.

According to another embodiment, the passive electrode structures 180 may emerge from the fill of wider and deeper trenches than the active electrode structures 150 such that the passive electrode structures 180 typically have a greater vertical extension than the active electrode structures 150 and shield the gate dielectrics 151 from electric field peaks.

The semiconductor device 500 of FIG. 3 is an IGBT with the semiconductor mesas 160 and the electrode structures 150, 180 including straight portions 160a, 150a, 180a parallel to the first lateral direction and slanted portions 160b, 150b, 180b extending along a direction intersecting the first lateral direction and connecting the straight portions 160a, 150a, 180a. The slanted portions 160b, 150b, 180b form the separation regions 400.

Sidewalls of the straight portions 160a, 150a, 180a may be [100] crystal planes and sidewalls of the slanted portions 160b, 150b, 180b may be [110] crystal planes. The lower effective cross-sectional area of the slanted portions 160b of the semiconductor mesas 160 and/or lower hole mobility in [110] crystal planes result in better hole confinement in the transistor cells TC. The higher oxide growth rate on [110] crystal planes compared to that on [100] crystal planes may form the ancillary dielectrics 411 as described in FIG. 2A without further patterning processes. For selected embodiments, this may further lead to a closing of the semiconductor mesas 160 by through-oxidation in the separation regions 400.

FIGS. 4A to 4F refer to embodiments of a semiconductor device 500 with separation regions 400 that include at least one dielectric separation structure 421 completely constricting the concerned semiconductor mesa 160, respectively. Where the semiconductor mesa 160 is completely constricted, the cross-sectional area is zero. The dielectric separation structure 421 may exclusively include dielectric materials or may include, in addition to dielectric materials, conductive materials as well as dielectric materials separating the conductive materials from the surrounding semiconductor material or may include a void filled with a fluid, for example, trapped air.

The constricted sections of the semiconductor mesas 160 may correspond to bulges in the adjoining electrode structures 150, 180 and the dielectric separation structures 421 are formed by abutting sections of the gate and field dielectrics 151, 181. A width of one or both of the electrode structures 150, 180 may be wider in a section adjoining the semiconductor mesa 160 in the separation region 400 than in a section adjoining the semiconductor mesa 160 outside of the separation region 400.

Outside the constricted sections, the active and passive electrode structures 150, 180 may have the same width and depth. According to other embodiments, the passive electrode structures 180 may have a greater vertical extension than the active electrode structures 150. For example, the passive electrode structures 180 may emerge from trenches that are wider than trenches for the active electrode structures 150 such that the trenches for the passive electrode structures 180 are etched deeper into the semiconductor body 100 than the trenches for the active electrode structures 150. As a result, the electric field maxima appear at the edges of the passive electrode structures 180 and the reliability of the gate dielectrics 151 can be improved.

The separation structure 421 may be a homogeneous structure of one single dielectric material or may be a layer structure including two or more sub-layers of different materials. For example, the separation structure 421 is formed from silicon oxide. According to an embodiment the separation structure 421 consists of or includes a dielectric material with higher heat conductivity and/or heat capacity than silicon oxide, e.g., diamond or a dielectric phase change material. According to another embodiment the separation structure 421 includes a dielectric sub-layer directly adjoining the semiconductor mesa 160 as well as a conductive material with higher heat conductivity and/or heat capacity than silicon oxide, e.g., copper or a conductive phase change material, wherein the conductive material is without low-ohmic connection to the gate electrode 155 and the field electrode 185. According to another embodiment, the separation structure includes a dielectric sub-layer directly adjoining the semiconductor mesa 160 and a void filled with trapped ambient air.

According to an embodiment each separation region 400 includes one single separation structure 421 symmetrically arranged with regard to a vertical plane at the half distance between neighboring source zones 110 assigned to the same semiconductor mesa 160. The separation structure 421 may extend over at least 3% of the distance between the two concerned source zones 110, for example over at least 50% or at least 90%. A distance between the source zones 110 and the respective separation structure 421 may be at least 2 µm or at least 5 µm.

The illustrated semiconductor device 500 refers to an embodiment with at least two separation structures 421 per separation region 400. The at least two separation structures 421 may be symmetric with respect to a vertical plane at the half distance between the concerned source zones 110. An auxiliary mesa 425 may separate the separation structures 421. The heat conductivity of the auxiliary mesa 425 may be better than the heat conductivity of the separation structures 421 and may increase robustness against short-circuit-induced thermal destruction. In addition, the auxiliary mesa 425 may keep mechanical stress low that may result from different coefficients of temperature expansion for the separation structures 421 and the semiconductor body 100.

The separation structures 421 may directly adjoin the neighboring source zones 110. According to the illustrated embodiment, a distance between the separation structure 421 and the source zone 110 is set such that the presence of the separation structure 421 does not affect the threshold voltage of the semiconductor device 500. In addition, below a design-specific minimum distance a relative increase of the carrier density in and around the transistor cell TC is less than a relative increase of a current density induced by the separation structure 421 such that a voltage drop in the semiconductor mesa 160 may adversely increase $V_{CE,sat}$. According to the illustrated embodiment, a distance between the separation structure 421 and the source zone 110 is at least half of the mesa width of the semiconductor mesa 150, for example at least the mesa width.

The separation structures 421 may extend from the first surface 101 to at least 90% of the distance between the first surface 101 and the second pn junction pn2 or down to the second pn junction pn2. According to the illustrated embodiment, the vertical extension of the separation structures 421 is greater than the vertical extension of the electrode structures 150, 180. A maximum value of the electric-field strength is pulled away from the buried edges of the electrode structures 150, 180 and the gate and field dielectrics 151, 181. As a result the gate and field dielectrics 151, 181 are subjected to lower maximum electric field peaks. Field-induced degradation of the gate and field dielectrics 151, 181 is reduced and long-term stability of the semiconductor device 150 increased.

Figure 4A:
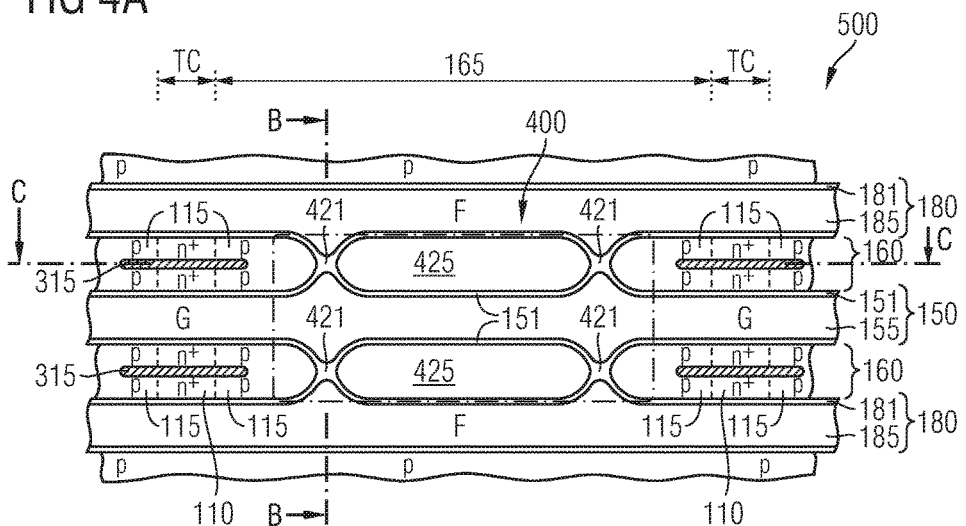
FIG. 4A is a schematic lateral cross-sectional view of a portion of a semiconductor device with dielectric separation structures between neighboring source zones in accordance with a further embodiment related to IGBTs.
Figure 4B:
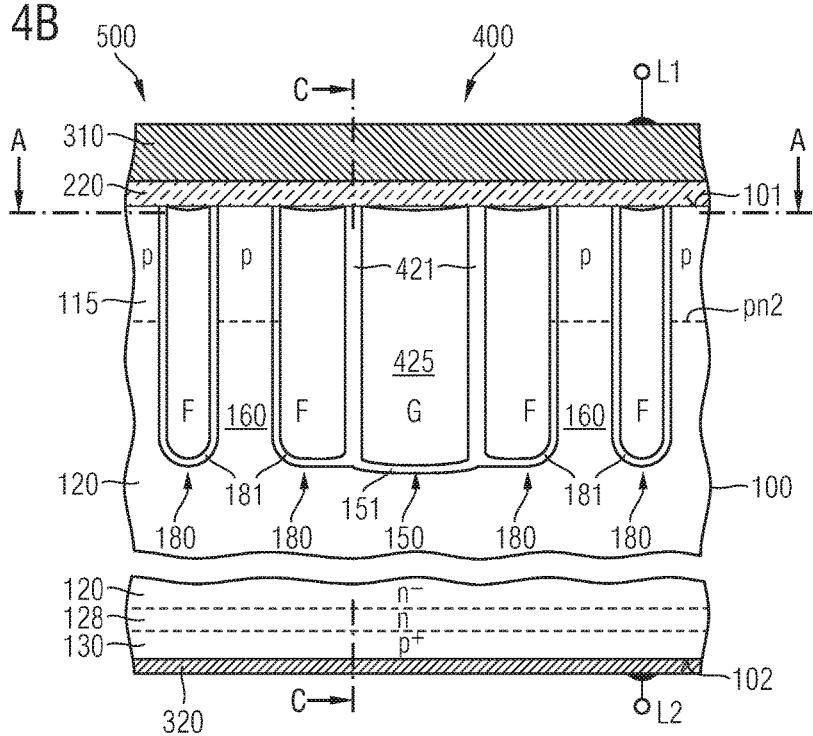
FIG. 4B is a schematic cross-sectional view of the semiconductor device portion of FIG. 4A along line B-B.
Figure 4C:
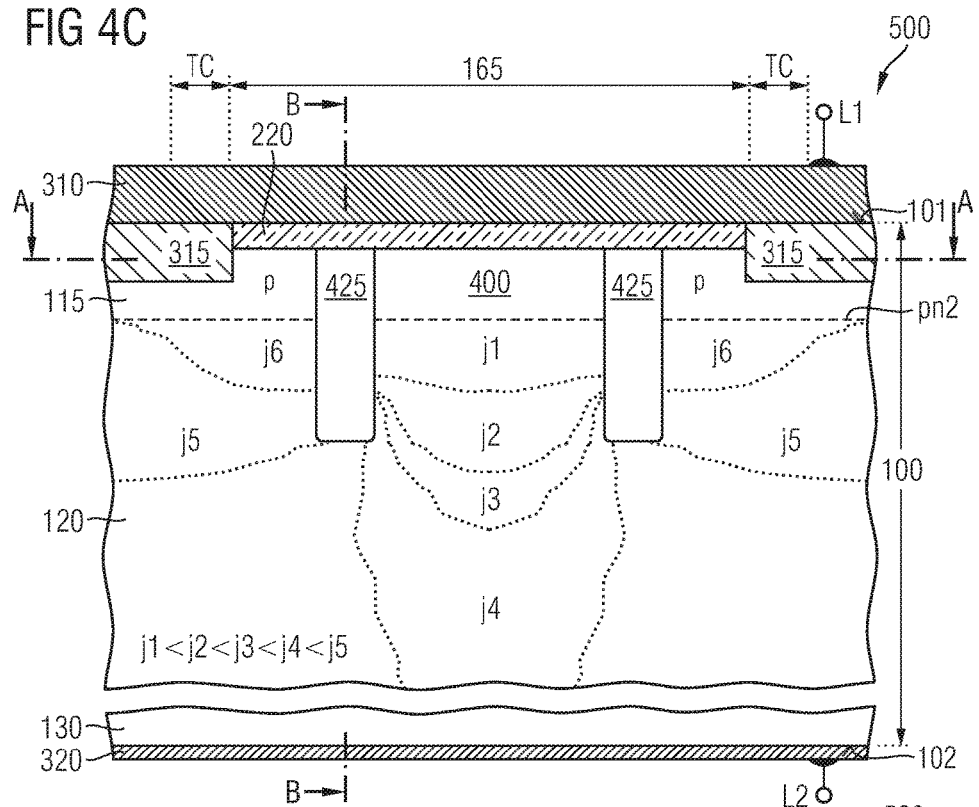
FIG. 4C is a schematic cross-sectional view of the semiconductor device portion of FIG. 4A along line C-C and schematically illustrates a current density distribution in the semiconductor body of the semiconductor device of FIG. 4A.
Figure 4D:
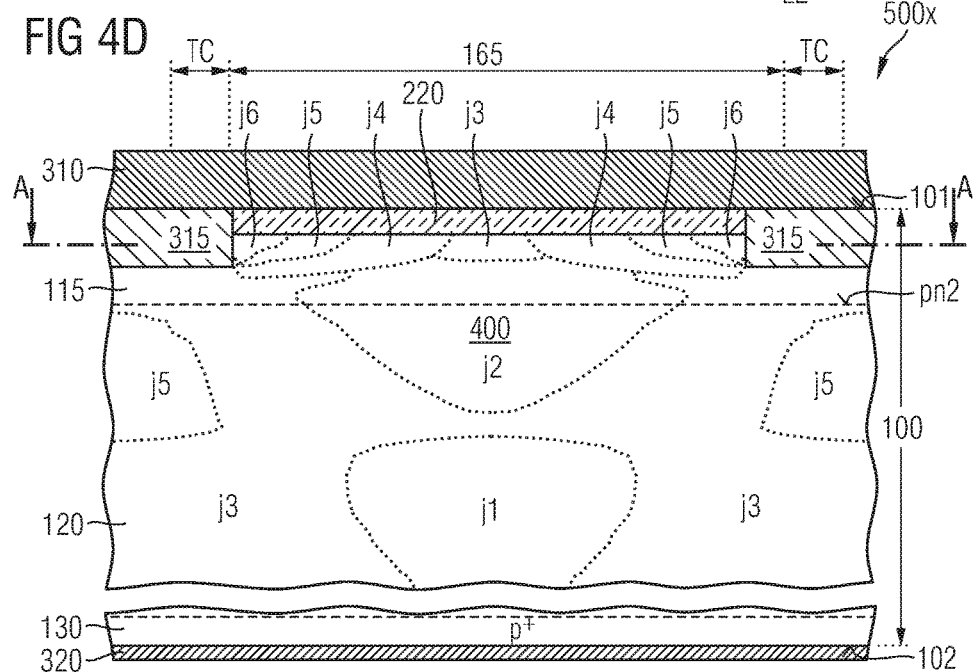
FIG. 4D is a schematic cross-sectional view of a semiconductor device portion of a reference device and schematically illustrates a current density distribution in the semiconductor body of the reference device.

FIG. 4C schematically illustrates the current density distribution in the semiconductor device 500 at a continuous collector current $I_C$ and FIG. 4D shows the corresponding current density distribution in a reference device 500x without separation structures 421.

In the reference device 500x, a high surface current along the first surface 101 in direction of the front surfaces of the contact structures 315 indicates that a significant number of holes enter the body zone 115 outside the transistor cells TC. By contrast the separation structures 421 guide the current flow mainly within the transistor cells TC and the directly adjoining portions of the shadowed regions 165 between the transistor cells TC and the respective separation structure 421. Holes and electrons move to a higher degree close to each other resulting in a better carrier confinement and higher local charge carrier plasma density.

Figure 4E:
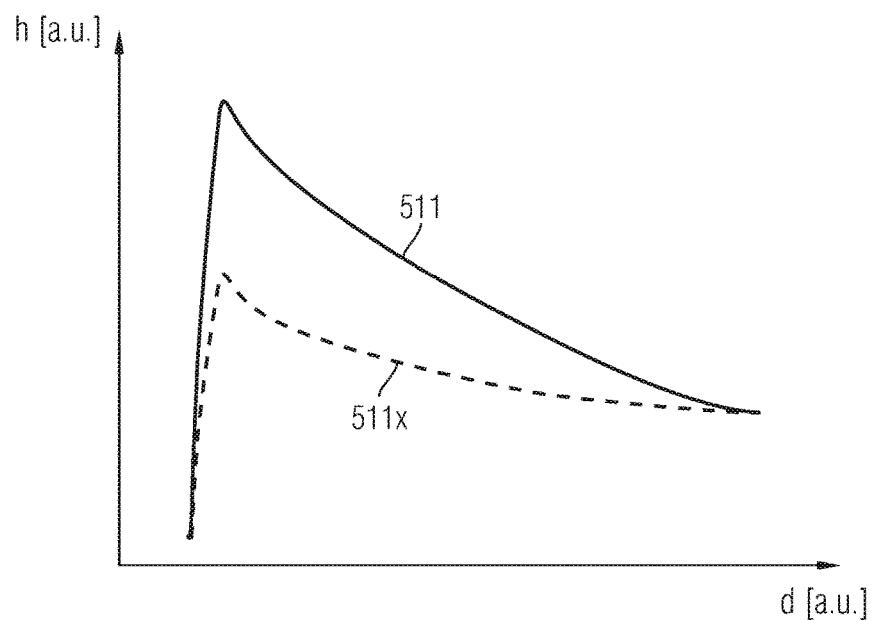
FIG. 4E is a diagram for schematically illustrating the hole concentration in the semiconductor device of FIGS. 4A to 4C.

FIG. 4E compares the vertical gradients 511, 511x of the hole concentration in the semiconductor device 500 of FIGS. 4A to 4C and the hole concentration in the reference device 500x through the center of the source zones 110, respectively. The separation structures 421 significantly increase the hole concentration within the drift zone 120.

Figure 4F:
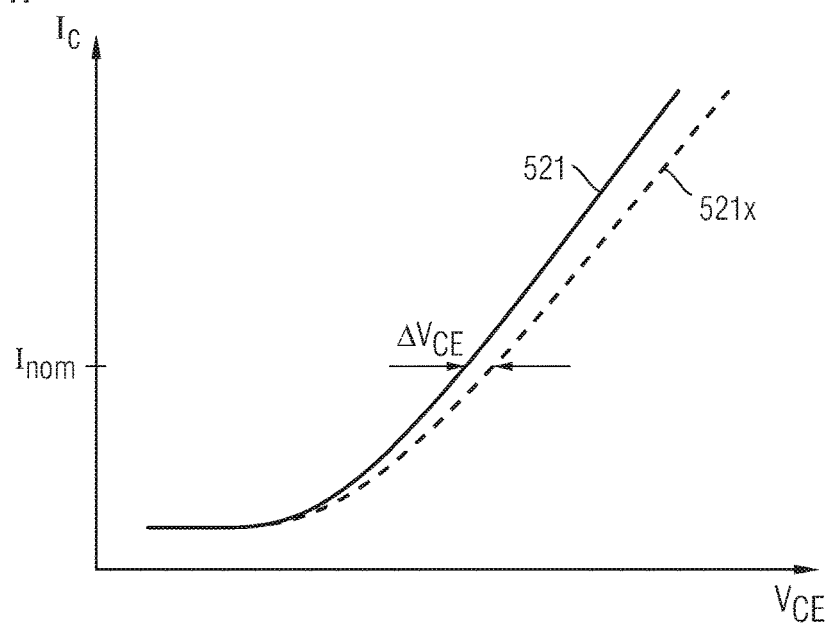
FIG. 4F is a diagram for schematically illustrating the effect of the separation structures on the IGBT on-state characteristic of the semiconductor device of FIGS. 4A to 4C.

FIG. 4F compares the on-state characteristics 521, 521x of the semiconductor device 500 of FIGS. 4A to 4C and the reference device 500x of FIG. 4D. At a current $I_{nom}$ defined by the continuous collector current $I_C$ of the semiconductor device 500, the separation structures 421 may decrease $V_{CE,sat}$ by about 100 mV, while the two devices exhibit the same saturation current (not shown).

The embodiments of FIGS. 4A to 4F refer to reverse blocking IGBTs with continuous p-type pedestal layers 130. Other embodiments may refer to RC-IGBTs, by way of example. For example, an RC-IGBT may include a first portion designed for the reverse-conducting mode and including zones of both conductivity types in the pedestal layer 130 and a second portion designed for the IGBT mode and including separation regions 400 as described above. The contact structures 315 are aligned to the source zones 110 and are absent in the vertical projection of the auxiliary mesas 425.

Figure 5A:
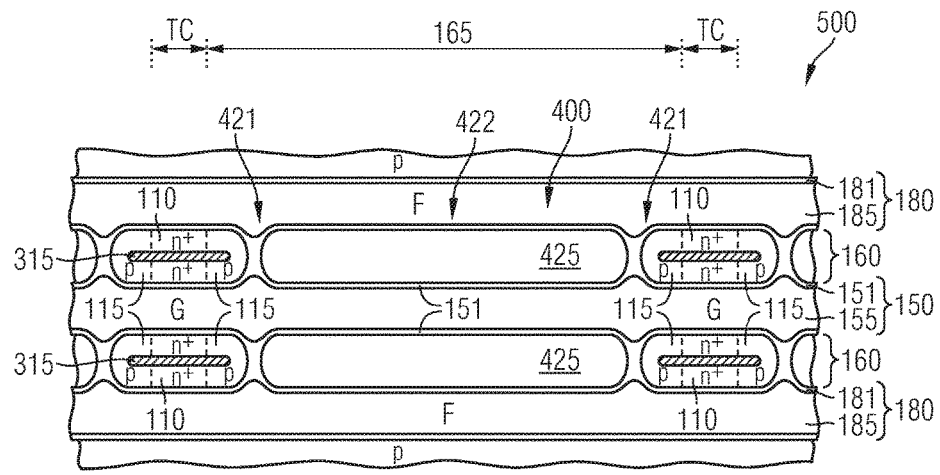
FIG. 5A is a schematic lateral cross-sectional view of a portion of a semiconductor device according to an embodiment related to completely constricted semiconductor mesas.

The semiconductor device of FIG. 5A includes completely constricted semiconductor mesas 160, wherein the semiconductor mesas 160 are constricted by separation structures 421 that result from an oxidation of the material of the semiconductor mesas 160, wherein, before oxidation, precursor semiconductor mesas are provided with constrictions sufficiently narrow to be completely through-oxidized.

The semiconductor mesas 160 and auxiliary mesas 425 formed between the separation structures 421 may taper with decreasing distance to the separation structures 421, respectively. In a silicon semiconductor body 100 the tapered portions may have [110] crystal planes and the straight portions [100] crystal planes. Portions of the gate dielectric 151 on the tapered portions of the semiconductor and auxiliary mesas 160, 425 may be thicker than on the straight portions.

Figure 5B:
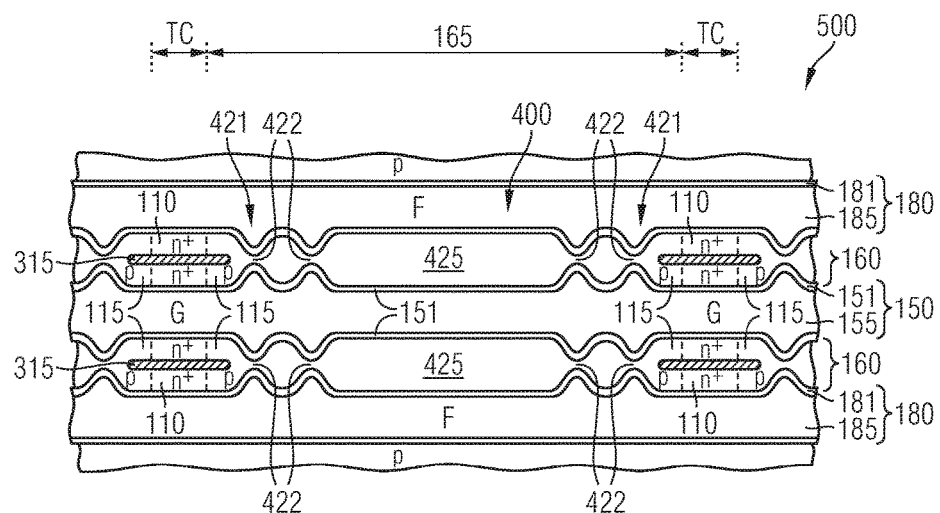
FIG. 5B is a schematic lateral cross-sectional view of a portion of a semiconductor device according to an embodiment related to partially constricted semiconductor mesas.

The semiconductor device of FIG. 5B includes partially constricted semiconductor mesas 160, wherein separation structures 421 partially constricting the semiconductor mesas 160 result from an oxidation of the material of the semiconductor mesas 160 and, before oxidation, precursor semiconductor mesas are provided with constrictions sufficiently wide, such that the constrictions are not completely through-oxidized. Instead, a remaining semiconducting connecting portion 422 connects the portions of the semiconductor mesas 160 adjoining the respective separation structure 421 on opposite sides along the extension direction.

The semiconductor device 500 of FIG. 6 includes first separation regions 400a with separation structures having a first distance to the neighboring source zone, respectively and second separation regions 400b with separations structures having a second distance, which is greater than the first distance, to the neighboring source zone. In the portions of the semiconductor device 500 including the first separation regions 400a the on-state plasma density is higher than in portions including the second separation regions 400b.

The first separation regions 400a may dominate in a central portion 191a of an active area 191 of the semiconductor body 100 including the transistor cells. The second separation regions 400b may be arranged at a higher density in a transition portion 191b of the active area 191 between the central portion 191a and an edge termination area 199 without transistor cells between the active area 191 and an outer surface 103 connecting the first and second surfaces 101, 102 or in portions of the active area 191 in whose vertical projection gate pads and gate connections are arranged. Less charge carriers flood the edge area 199 during the on-state IGBT mode and less charge carriers have to be removed from the edge area 199 when the semiconductor device 500 is switched off. The locally reduced charge carrier plasma density along the edge area 199 reduces commutation losses and improves turn-off ruggedness of the semiconductor device 500.

Figure 7:
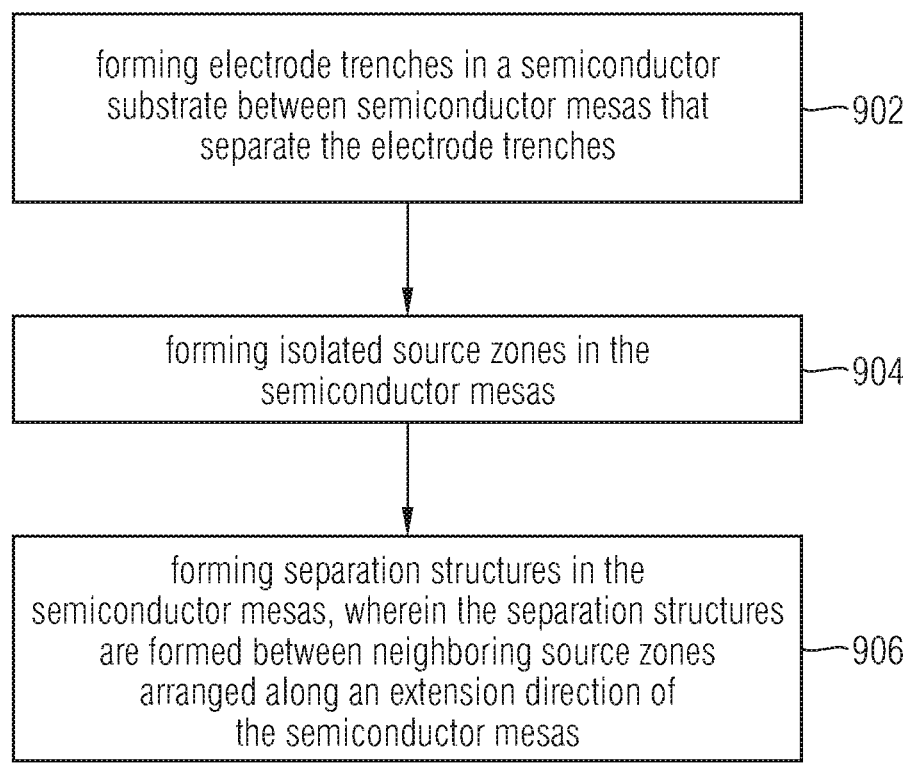
FIG. 7 is a schematic flow chart for illustrating a method of manufacturing a semiconductor device according to a further embodiment.

FIG. 7 refers to a method of manufacturing a semiconductor device, e.g., a semiconductor diode or an IGBT, for example an RC-IGBT or a semiconductor device including IGBT functionality.

In a semiconductor substrate electrode trenches are formed between semiconductor mesas that separate the electrode trenches (902). The semiconductor mesas include portions of a drift layer of a first conductivity type and a body layer of a second, complementary conductivity type between a first surface of the semiconductor substrate and the drift layer. In the semiconductor mesas isolated source zones of the first conductivity type are formed (904). The source zones extend from the first surface into the body layer. Separation structures are formed in the semiconductor mesas (906). The separation structures are formed between neighboring source zones which are arranged along an extension direction of the semiconductor mesas.

Forming the separation structures may include forming separation trenches in the semiconductor mesas and at least partly filling the separation trenches with a dielectric material to form the separation structures in the separation trenches. For example, a dielectric layer lining the separation trenches may be formed by a deposition process, by thermal oxidation of the semiconductor material of the semiconductor mesas, or by a combination of both. Then a fill material, e.g., a further dielectric material, intrinsic semiconductor material and/or conductive material may be deposited to fill the lined separation trenches. The fill material may be material with high heat capacity and/or heat conductivity. According to other embodiments the lined electrode trenches are only occluded and remain filled with trapped ambient air.

The separation trenches may be formed before, contemporaneously with or after the electrode trenches. The separation trenches may have a greater vertical extension than the body layer. According to an embodiment, the separation trenches may be as deep as or may be deeper than the electrode trenches. The source zones may be formed before or after the forming of the separation structures.

According to another embodiment forming the separation structures may include that during formation of the electrode trenches the semiconductor mesas are formed with constricted portions such that the separation structures can emerge from an oxidation of the material of the semiconductor mesas in the constricted portions, which may be completely through-oxidized. In this way, formation of the separation structures may be combined with the formation of the gate dielectric and/or the field dielectric. No additional process is required for the formation of the separation structures such that the separation structures may be implemented by slight modifications of the photolithographic mask for the electrode trench patterning.

FIGS. 8A to 8H show layouts of precursor semiconductor mesas 160a after etching the electrode trenches and before oxidizing constricted portions 169 to form dielectric separation structures. The oxidation may completely through-oxidize the constricted portion 169 or may stop before the constricted portion 169 is completely through-oxidized such that semiconducting connecting portions connect portions of the concerned semiconductor mesa on opposing sides of the constricted portion 169 in the finalized device. Each separation structure may result from one, two or more constricted portions 169. A layout including constrictions allows the formation of separation structures as described above without any additional process step, e.g., an additional lithography process.

The illustrated precursor semiconductor mesas 160a include portions 167 having a mesa width W1 and constricted portions 169 having a constriction width W3. The electrode trenches 150a between neighboring precursor semiconductor mesas 160a have an electrode width W2. The constriction width W3 may be set such that the precursor semiconductor mesa 160a is completely through-oxidized in the constricted portion 169, e.g., during formation of the gate dielectric. According to another embodiment, the constricted portions 169 are not completely through-oxidized such that the resulting semiconductor mesas in the finalized device are only narrowed.

Figure 8A:
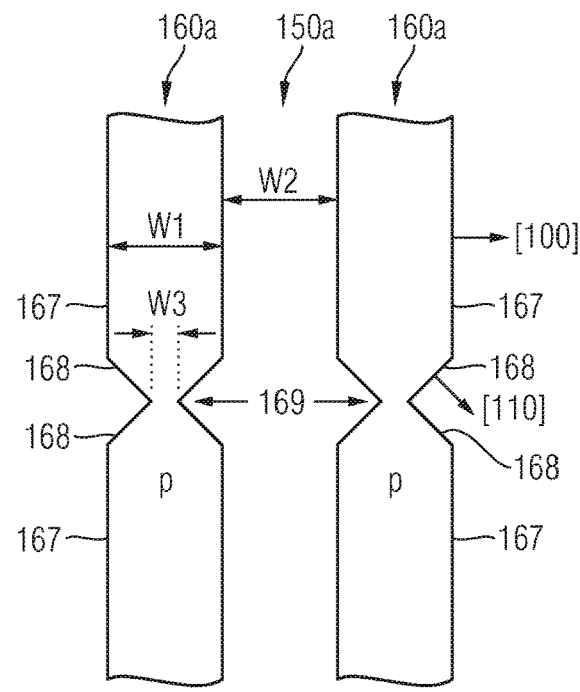
FIG. 8A is a schematic plan view of a layout for precursor semiconductor mesas according to an embodiment providing constricted portions at a contact area of tapering portions.

In FIG. 8A each constricted portion 169 is formed at the contact area of two directly adjoining mirror-inverted tapering portions 168 of the respective precursor semiconductor mesa 160a. The tapering portions 168 connect the constricted portion 169 with the portions 167 of mesa width W1.

According to an embodiment, the precursor semiconductor mesas 160a are of single-crystalline silicon, sidewalls of the portions 167 of uniform width are [100] crystal planes, and sidewalls of the tapering portions 168 are [110] crystal planes. Since an oxidation rate in the [110] crystal planes is significantly higher than in [100] crystal planes, the constriction width W3 may be set significantly wider than the thickness of the gate dielectric. The precursor semiconductor mesas 160a are mechanically stable during a process phase after etching the electrode trenches 150a and before forming electrode structures in the electrode trenches 150a.

Figure 8B:
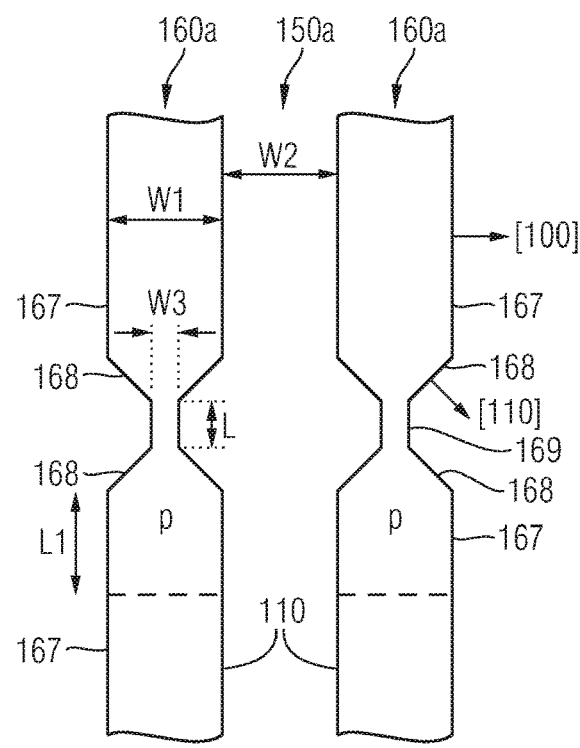
FIG. 8B is a schematic plan view of a layout for precursor semiconductor mesas according to an embodiment providing constricted portions of uniform length between tapering portions.

In FIG. 8B each constricted portion 169 is formed by a narrow portion of uniform constriction width W3 and a length L between two adjoining mirror-inverted tapering portions 168. The constriction width W3 can be well controlled without optical proximity correction features.

The tapering in the tapered portions of FIGS. 8A and 8B is two-sided and may be symmetric with respect to a longitudinal center axis of the respective precursor semiconductor mesa 160a.

Figure 8C:
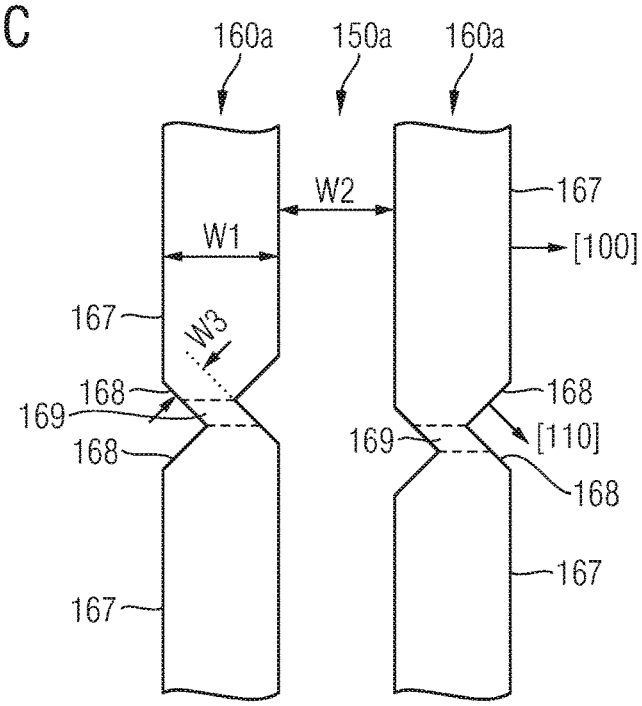
FIG. 8C is a schematic plan view of a layout for precursor semiconductor mesas according to an embodiment providing constricted portions in an overlap region of asymmetric tapering portions.

FIG. 8C refers to precursor semiconductor mesas 160a with two-sided tapering in the tapered portions 168, wherein a tapering on a first side and a tapering on a second, opposite side are shifted to each other along a longitudinal center axis of the precursor semiconductor mesa 160a. An overlapping region of the two tapered portions 168 forms the constricted portion 169. The layout of FIG. 8C mediates between mesa narrowing and the fill quality for the materials filling the electrode trenches 150a.

Figure 8D:
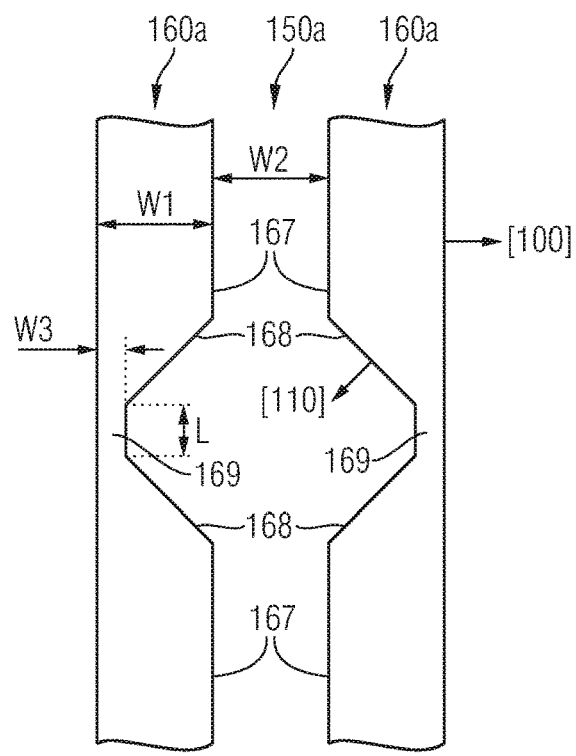
FIG. 8D is a schematic plan view of a layout for precursor semiconductor mesas according to an embodiment providing constricted portions between one-sided tapering portions.

The precursor semiconductor mesas 160a in FIG. 8D include tapered portions 168 with one-sided tapering. Narrow portions of constriction width W3 and a length L between two adjoining mirror-inverted one-sided tapering portions 168 may form the constricted portions 169. By providing pairs of neighboring precursor semiconductor mesas 160a with one-sided tapered portions 168 mirror-inverted with respect to a longitudinal central axis of the intermediate electrode trench 150a, both width and depth of the electrode trench 150a can be locally increased. The precursor semiconductor mesa 160a can be oxidized to a depth greater than the vertical extension of the precursor semiconductor mesas 160a outside the constricted portions 169.

Figure 8E:
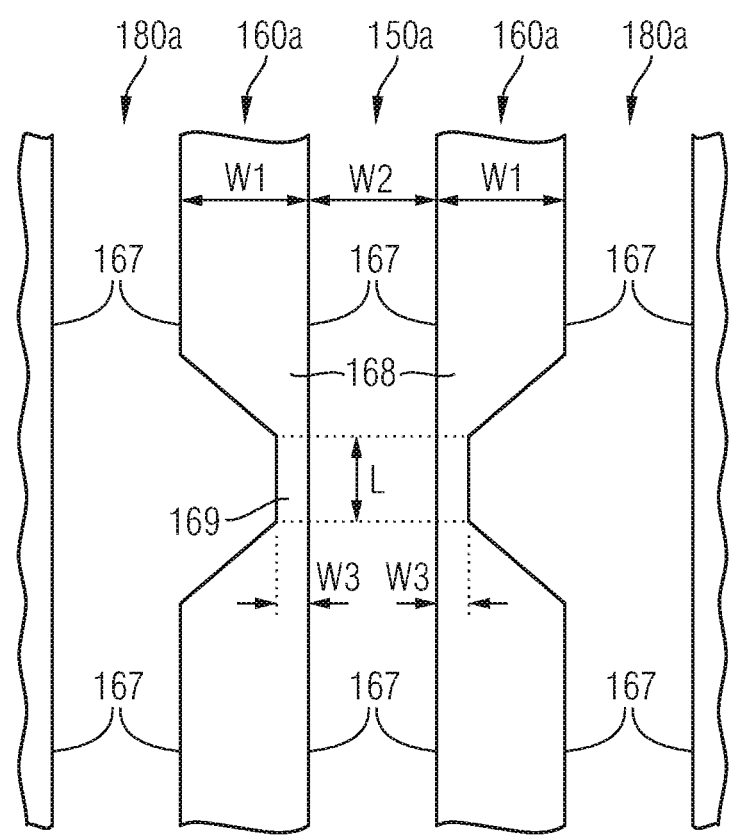
FIG. 8E is a schematic plan view of another layout for precursor semiconductor mesas according to an embodiment providing constricted portions between one-sided tapering portions.

In FIG. 8E two precursor semiconductor mesas 160a are arranged mirror-inverted with respect to a longitudinal axis through an intermediate electrode trench 150a, wherein the constricted portions 169 are arranged opposed to each other and the intermediate electrode trench 150a has straight sidewalls.

In FIGS. 8F to 8H two parallel mesa branches 161 form the constricted portions 169, respectively, wherein each mesa branch 161 may have a branch width W5, which is narrower than the mesa width W1. Each of the parallel mesa branches 161 connects two portions 167 of mesa width W1. The precursor semiconductor mesas 160a are comparatively stable during a process phase after etching the electrode trenches 150a and before filling the electrode trenches 150a.

In FIG. 8F, due to the smaller width W4 of the portions of the electrode trenches 150a adjoining the mesa branches 161, the precursor semiconductor mesas 160a can be oxidized only to a depth lower than the vertical extension of the semiconductor mesas outside of the constricted portions 169.

FIG. 8G refers to an embodiment that differs from the embodiment of FIG. 8F in that the width W4 of the portions of the electrode trenches 150a adjoining the mesa branches 161 is wider than the electrode width W2. Due to the greater width W4 of the portions of the electrode trenches 150a adjoining the mesa branches 161, the precursor semiconductor mesas 160a can be oxidized to a depth deeper than the vertical extension of the semiconductor mesas 160 outside of the constricted portions 169.

In FIG. 8H the mesa branches 161 are formed such that the electrode width W2 remains approximately unaltered and straight oxide structures are formed along the electrode trenches 150a.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor mesa comprising source zones and at least one body zone forming first pn junctions with the source zones and a second pn junction with a drift zone;
electrode structures on opposite sides of the semiconductor mesa, at least one of the electrode structures comprising a gate electrode configured to control a charge carrier flow through the at least one body zone; and
a separation region arranged along an extension direction of the semiconductor mesa,
wherein in the separation region, the semiconductor mesa comprises a constricted portion that is partially or completely oxidized.

2. The semiconductor device of claim 1, wherein the constricted portion comprises a completely through-oxidized region of the semiconductor mesa such that no semiconducting connecting portions connect portions of the semiconductor mesa on opposing sides of the constricted portion.

3. The semiconductor device of claim 1, wherein the constricted portion comprises a partially through-oxidized region of the semiconductor mesa such that semiconducting connecting portions connect portions of the semiconductor mesa on opposing sides of the constricted portion.

4. The semiconductor device of claim 1, wherein the constricted portion is formed at a contact area of two directly adjoining mirror-inverted tapering portions of the semiconductor mesa.

5. The semiconductor device of claim 4, wherein the semiconductor mesa comprises single-crystalline silicon, wherein sidewalls of the semiconductor mesa outside the constricted portion have [100] crystal planes, and wherein sidewalls of the tapering portions have [110] crystal planes.

6. The semiconductor device of claim 4, wherein tapering in the tapered portions is two-sided and symmetric with respect to a longitudinal center axis of the semiconductor mesa.

7. The semiconductor device of claim 1, wherein the constricted portion is formed by a narrow portion of the semiconductor mesa having a uniform constriction width and a length between two neighboring mirror-inverted tapering portions of the semiconductor mesa.

8. The semiconductor device of claim 1, wherein the semiconductor mesa has two-sided tapering in neighboring mirror-inverted tapered portions, wherein a tapering on a first side and a tapering on a second opposite the first side of the tapered portions are shifted with respect to each other along a longitudinal center axis of the semiconductor mesa, and wherein an overlapping region of the tapered portions forms the constricted portion.

9. The semiconductor device of claim 1, wherein the semiconductor mesa has one-sided tapering in neighboring mirror-inverted one-sided tapering portions, and wherein a narrow portion having a uniform constriction width and a length between the neighboring tapering portions forms the constricted portion.

10. The semiconductor device of claim 1, wherein two parallel mesa branches of the semiconductor mesa form the constricted portion, and wherein each mesa branch has a width which is narrower than the width of the semiconductor mesa.

11. The semiconductor device of claim 10, wherein the width of the electrode structures decreases in a region adjoining the mesa branches.

12. The semiconductor device of claim 10, wherein the width of the electrode structures increases in a region adjoining the mesa branches.

13. The semiconductor device of claim 1, wherein each electrode structure has a uniform width.

14. A semiconductor device, comprising:
neighboring semiconductor mesas separated from one another by an electrode trench having a same lengthwise extension as the semiconductor mesas, each semiconductor mesa comprising source zones and at least one body zone forming first pn junctions with the source zones and a second pn junction with a drift zone; and
a separation region arranged along part of the lengthwise extension of each semiconductor mesa,
wherein in each separation region, the corresponding semiconductor mesa comprises a constricted portion that is partially or completely oxidized.

15. The semiconductor device of claim 14, wherein each constricted portion is formed at a contact area of two directly adjoining mirror-inverted tapering portions of the respective semiconductor mesa.

16. The semiconductor device of claim 14, wherein each constricted portion is formed by a narrow portion of the respective semiconductor mesa having a uniform constriction width and a length between two neighboring mirror-inverted tapering portions of the respective semiconductor mesa.

17. The semiconductor device of claim 14, wherein each semiconductor mesa has two-sided tapering in neighboring mirror-inverted tapered portions, wherein a tapering on a first side and a tapering on a second opposite the first side of the tapered portions are shifted with respect to each other along a longitudinal center axis of the semiconductor mesa, and wherein an overlapping region of the tapered portions forms the respective constricted portion.

18. The semiconductor device of claim 14, wherein each semiconductor mesa has one-sided tapering in neighboring mirror-inverted one-sided tapering portions, and wherein a narrow portion having a uniform constriction width and a length between the neighboring tapering portions forms the respective constricted portion.

19. The semiconductor device of claim 18, wherein the one-sided tapering of the neighboring semiconductor mesas faces away from each other so that the electrode trench separating the neighboring semiconductor mesas has a uniform width.

20. The semiconductor device of claim 14, wherein two parallel mesa branches of each semiconductor mesa form the respective constricted portion, and wherein each mesa branch has a width which is narrower than the width of the corresponding semiconductor mesa.

* * * * *